(12) United States Patent
Yoshimatsu et al.

(10) Patent No.: US 7,656,016 B2
(45) Date of Patent: Feb. 2, 2010

(54) POWER SEMICONDUCTOR DEVICE

(75) Inventors: Naoki Yoshimatsu, Fukuoka (JP); Takanobu Yoshida, Tokyo (JP); Toshiaki Shinohara, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 211 days.

(21) Appl. No.: 11/295,442

(22) Filed: Dec. 7, 2005

(65) Prior Publication Data

US 2006/0119512 A1    Jun. 8, 2006

(30) Foreign Application Priority Data

Dec. 8, 2004    (JP)    ............................. 2004-354826
Oct. 14, 2005    (JP)    ............................. 2005-300261

(51) Int. Cl.
   *H01L 23/02*    (2006.01)
(52) U.S. Cl. .............................. 257/686; 257/E25.027; 257/685; 257/706; 257/707; 342/372; 165/80.4
(58) Field of Classification Search .......... 257/E25.025, 257/714, E23.092, 686, 685, 712, 706, 707, 257/E25.023, E25.027, E21.38, E21.418, 257/E21.257, E29.257; 342/372; 361/699, 361/698, 689; 357/72, 75, 74, 82, 65; 165/80.4, 165/80.5
See application file for complete search history.

(56) References Cited

U.S. PATENT DOCUMENTS

| | | | |
|---|---|---|---|
| 3,784,885 A * | 1/1974 | Weidemann | 257/714 |
| 4,192,565 A * | 3/1980 | Gianni | 439/69 |
| 4,392,153 A * | 7/1983 | Glascock et al. | 257/746 |
| 4,878,106 A * | 10/1989 | Sachs | 257/796 |
| 5,050,037 A | 9/1991 | Yamamoto et al. | |
| 5,060,112 A | 10/1991 | Cocconi | |
| 5,615,475 A * | 4/1997 | Burns | 29/827 |
| 5,726,493 A * | 3/1998 | Yamashita et al. | 257/698 |
| 5,770,888 A * | 6/1998 | Song et al. | 257/696 |
| 5,801,437 A * | 9/1998 | Burns | 257/685 |
| 6,144,571 A * | 11/2000 | Sasaki et al. | 363/144 |
| 6,377,461 B1 * | 4/2002 | Ozmat et al. | 361/704 |

(Continued)

FOREIGN PATENT DOCUMENTS

FR    2 855 652 A1    12/2004

(Continued)

OTHER PUBLICATIONS

Translation of a German Office Action, dated Jul. 15, 2008, for German Application No. 102005057981.7.

(Continued)

*Primary Examiner*—Chris C Chu
(74) *Attorney, Agent, or Firm*—Buchanan Ingersoll & Rooney PC (57) ABSTRACT

One of the aspects of the present invention is to provide a power semiconductor device, which includes at least one pair of power modules, each of which has a molding surface covered with molding resin and a radiating surface opposite to the molding surface. Also, the power semiconductor device includes a pair of radiating fins sandwiching the power modules such that the molding surfaces of the power modules contact each other and the radiating surfaces thereof each contact the radiating fins.

16 Claims, 10 Drawing Sheets

U.S. PATENT DOCUMENTS

| | | | |
|---|---|---|---|
| 6,380,622 B1 * | 4/2002 | Hirai et al. | 257/712 |
| 6,442,023 B2 | 8/2002 | Cettour-Rose et al. | |
| 6,442,033 B1 * | 8/2002 | Liu et al. | 361/743 |
| 6,542,365 B2 * | 4/2003 | Inoue | 361/699 |
| 6,635,970 B2 * | 10/2003 | Lasky et al. | 257/777 |
| 6,870,271 B2 * | 3/2005 | Sutherland et al. | 257/777 |
| 6,917,103 B2 * | 7/2005 | Hirano et al. | 257/707 |
| 7,015,578 B2 | 3/2006 | Nakamura et al. | |
| 7,129,583 B2 * | 10/2006 | Tao et al. | 257/777 |
| 2004/0159962 A1 | 8/2004 | Ishiyama | |

FOREIGN PATENT DOCUMENTS

| | | |
|---|---|---|
| JP | 6-24279 | 2/1994 |
| JP | 2002-216860 | 8/2002 |
| JP | 2003-333702 | 11/2003 |
| JP | 2003-338592 | 11/2003 |
| JP | 2004-215340 | 7/2004 |

OTHER PUBLICATIONS

German Office Action, Jan. 29, 2007.

* cited by examiner

POWER SEMICONDUCTOR DEVICE

BACKGROUND OF THE INVENTION

1) Technical Field of the Invention

The present invention relates to a power semiconductor device, and in particular, relates to the power semiconductor device for controlling a motor used for, e.g., an electrical car.

2) Description of Related Arts

Recently, so called a hybrid-power car utilizing both of an engine and a motor has been commercialized, which requires an engine system dedicated for an automobile and an hybrid system including components such as a motor, an inverter device, and a battery, to be packed in a limited space such as an engine and trunk room. Therefore, demand for downsizing those components is intensive, and minimizing the semiconductor device in size is eagerly desired as well.

While the power module incorporated in the power semiconductor device has to be mounted on a radiating fin for radiating heat generated from the power module, in general, a plurality of the power modules are mounted on a wide surface of the radiating fin in a two-dimensional manner. However, this planner arrangement of the power modules limits flexibility in designing the total layout of the power modules, thereby inhibiting to downsize the power semiconductor device.

Also, when the power module having a mold package and a radiating surface is mounted on the radiating fin with the radiating surface closely contacted thereon, the mold package is directly screwed with the radiating fin. The long-term fastening force may cause the mold package to be crept in the local region where the force is applied, thereby loosening the screws. In order to avoid creeping the mold package, a metal plate having high rigidity is typically provided between the power module and the radiating fin which are together to be screwed, for distributing the fastening force by the screws equally across the mold package. However, this approach is not sufficient to prevent the screws from being loosened due to the resin creeping.

Several power semiconductor devices have been proposed, and for example, JPA 06-024279 discloses a cooling device for an electric automobile, in which a plurality of power modules is mounted on a radiating plate. Another reference, JPA 2003-333702 discloses a motor controller having a plurality of semiconductor elements provided on the heat sink. In JPA 2004-215340, the power installation structure for an inverter device is disclosed having the power modules provided on the U-shaped radiating plate. Also, JPA 2002-216860 discloses a cylindrical cooling jacket. Further, JPA 2003-338592 discloses a power semiconductor module having a coil spring provided between the power module and the control board.

Thus, the present invention was made for addressing those problems as described above, and one of the aspects thereof is to provide a downsized power semiconductor device having a plurality of power modules mounted on a radiating fin.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

One of the aspects of the present invention is to provide a power semiconductor device, which includes at least one pair of power modules, each of which has a molding surface covered with molding resin and a radiating surface opposite to the molding surface. Also, the power semiconductor device includes a pair of radiating fins sandwiching the power modules such that the molding surfaces of the power modules contact each other and the radiating surfaces thereof each contact the radiating fins.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper", "lower", "upwardly", and "downwardly") are conveniently used just for clear understandings, it should not be interpreted that those terminology limit the scope of the present invention.

Embodiment 1

Figure 1:
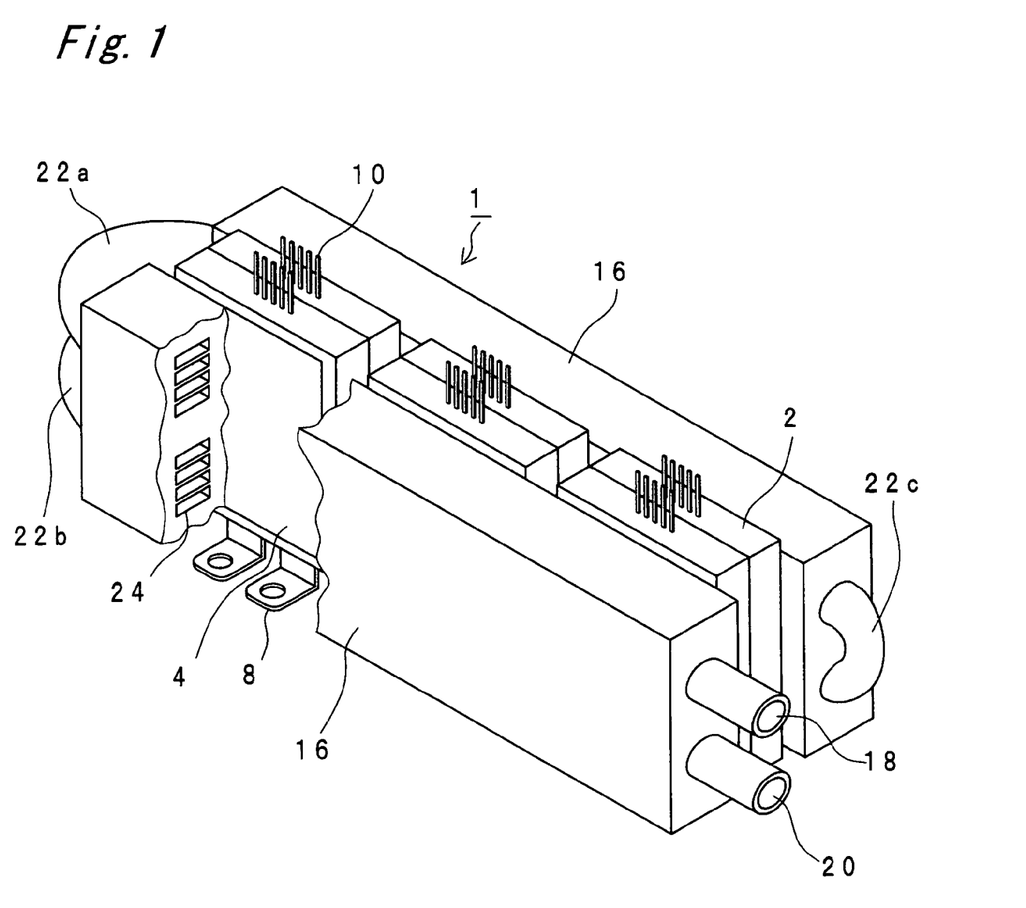
FIG. 1 is a perspective view of a power semiconductor device 1 according to the first embodiment of the present invention, wherein a portion of a radiating fin is exploded for clarifying an internal structure thereof.
Figure 2:
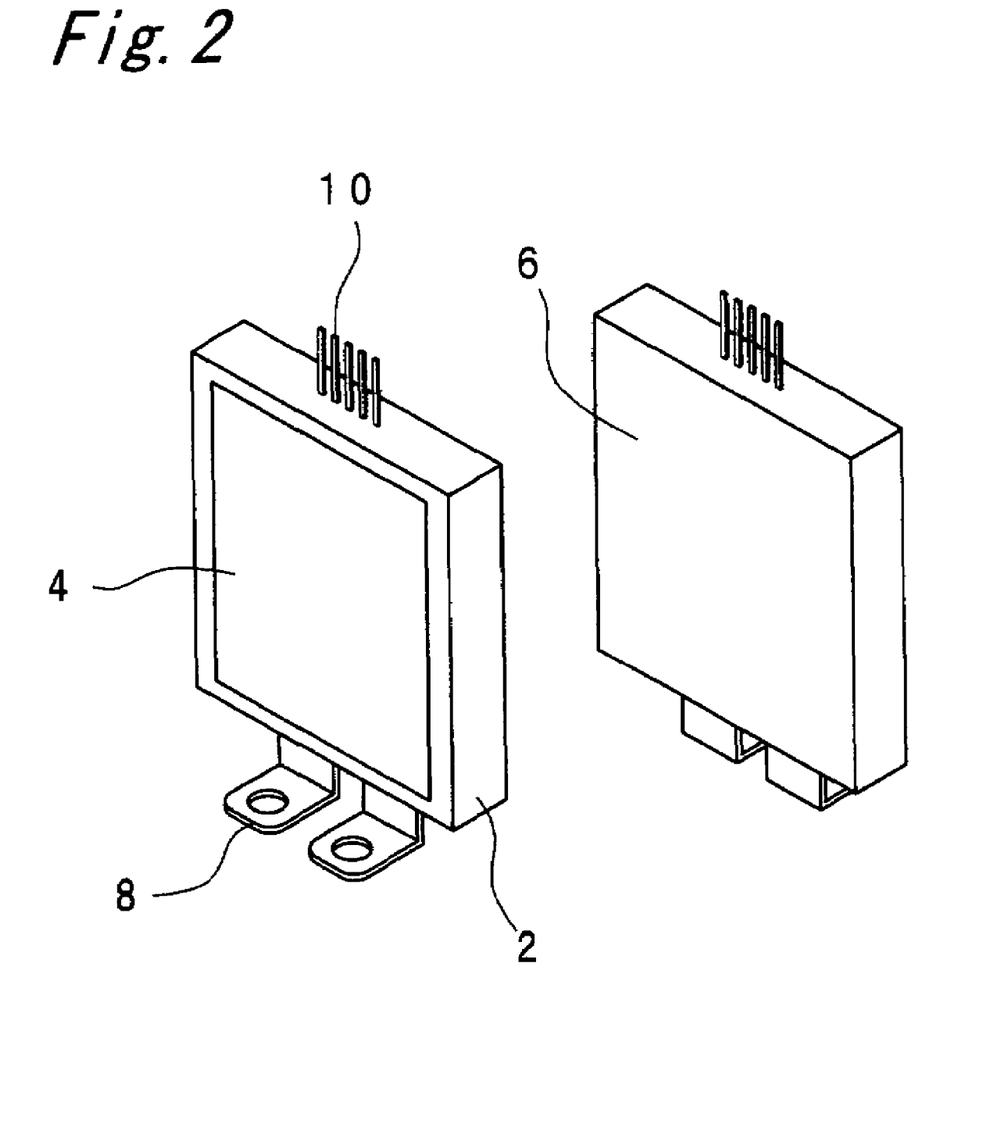
FIG. 2 is a perspective view of a transfer-mold type power module incorporated in the power semiconductor device according to the first embodiment of the present invention.

FIG. 1 is a perspective view of a power semiconductor device 1 according to the first embodiment of the present invention, while a portion of a radiating fin is exploded for clarifying an internal structure thereof. FIG. 2 is also a perspective view of a transfer-mold type power module 2 incorporated in the power semiconductor device 1 illustrated in FIG. 1.

Figure 10:
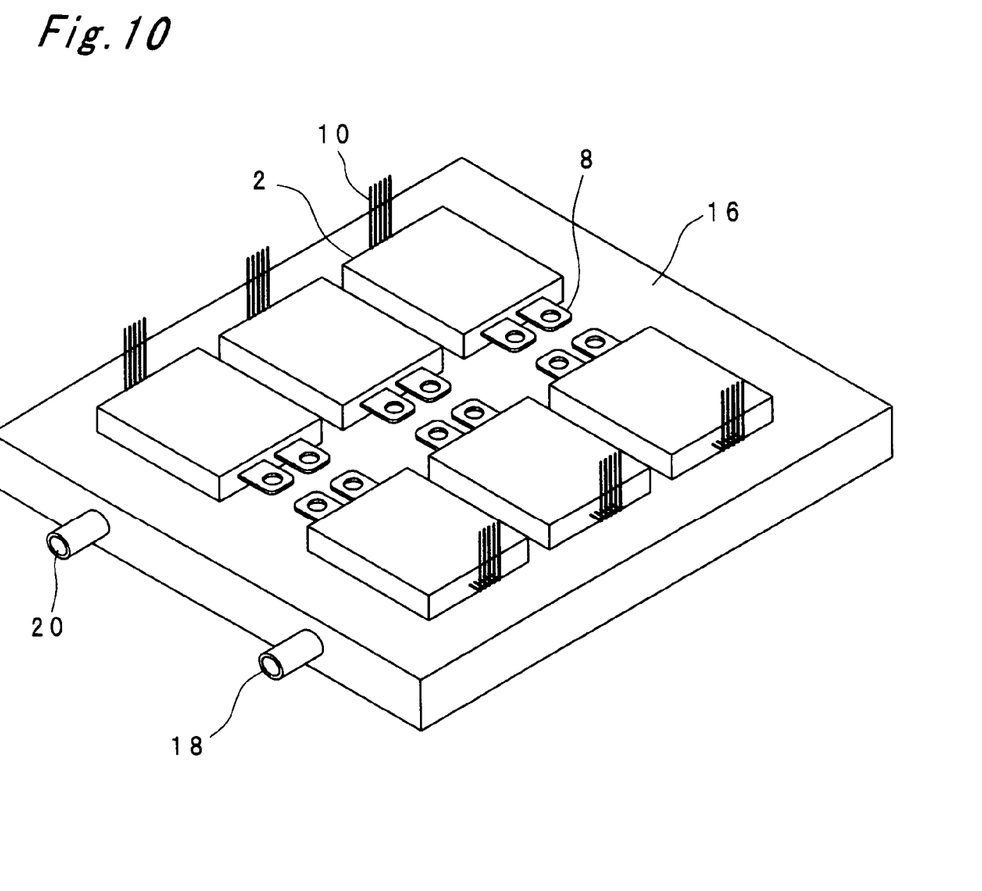
FIG. 10 is a perspective view of a typical power semiconductor device.

Before describing structure of the power semiconductor device of the present invention, with reference to FIG. 10, discussion will briefly be made herein for a typical power semiconductor device used for a hybrid-power car. The power semiconductor device of FIG. 10 includes a plurality of transfer-mold type power modules 2, each of which includes a radiating surface. The power modules 2 are arranged on a radiating fin (cooling device) 16, such that each of the radiating surfaces of the power modules 2 is closely contacted with the upper surface of the radiating fin 16. The radiating fin 16 is provided with a coolant channel through which coolant circulates inside the cooling device 16 from an inlet 18 to an outlet 20. Heat generated from the power modules 2 is transmitted through the radiating surface and absorbed by the coolant running through the channel of the radiating fin 16. However, the radiating fin 16 has a large flat surface as illustrated in FIG. 10, which inhibits the downsizing of the device. In view of this drawback, the first embodiment of the present invention will be described herein.

The power module 2 of the power semiconductor device 1 according to the first embodiment is in a form of rectangular solid body having two flat main surfaces, as illustrated in FIG. 2. One of the flat main surfaces (first main surface or molding surface 6) and four side surfaces of the power module 2 are molded or covered with resin, and the other one of the flat main surfaces (second main surface or radiating surface 4) is covered by a metal plate of high thermal conductivity for radiating heat from the power semiconductor chip such as an Insulated Gate Bipolar Transistor (IGBT) chip and a Free Wheel Diode (FWD) chip formed therein. Also, the power module 2 includes a pair of main terminals 8, which is a collector terminal (C-terminal) and an emitter terminal (E-terminal), and one or more control terminal 10 such as a gate terminal and various sensing terminals.

The power semiconductor device 1 according to the first embodiment of the present invention uses at least one pair of the power modules 2. Thus, two of the power modules are coupled so that the molding surfaces 6 of each power module 2 closely contact to each other, and the radiating surfaces 4 of each power module 2 face outwardly. Also, as shown in FIG. 1, three pairs of the power modules 2 are arranged such that the radiating surfaces 4 thereof are aligned to one another, and main and control terminals 8, 10 extend downwardly and upwardly from the opposing side surfaces (upper and lower side surfaces) of the power module 2, respectively. The number of pairs of the power modules 2 may be more or less than three. Further, the power semiconductor device 1 includes a pair of radiating fins 16 sandwiching three pairs (six) of the transfer-mold power modules 2 therebetween so that the radiating surfaces 4 of those power modules 2 closely contact with the radiating fins 16. Preferably, silicone grease of high thermal conductivity may be applied on the radiating surfaces 4 of the power modules 2 and/or contacting surfaces (not shown) of the radiating fins 16 facing to the radiating surfaces 4. Also, any appropriate fasteners (not shown) may be used for allowing the radiating fins 16 to pinch or press the power modules 2, thereby radiating heat generated the power semiconductor chips inside the power modules 2 through the radiating surfaces 4 and the radiating fins 16 in an efficient manner. As long as the radiating fins 16 securely hold the power modules 2 intervened therebetween, any type of the fasteners may be used, and include, for example, screws and threatened holes provided through the radiating fins 16 and/or the power modules 2.

According to the first embodiment of the present invention, each of the radiating fins 16 includes substantially the same structure having the coolant channels 24 extending horizontally, as illustrated in the exploded portion of FIG. 1. Also, one of the radiating fins 16 (the front side one shown in FIG. 1) has an inlet 18 and an outlet 20 in fluid communication with the upper and lower four coolant channels 24, respectively. The other one of the radiating fins 16 (the rear side one shown in FIG. 1) also has the upper and lower four coolant channels in fluid communication through the pipes 22a, 22b with the upper and lower four coolant channels 24 of the front side radiating fin 24, respectively. The upper and lower four coolant channels of the rear side radiating fin are connected to each other through the pipe 22c. Therefore, the coolant is circulated from the inlet 18 to the outlet 20 through the upper channels of the front radiating fin, the pipe 22a, the upper channels of the rear radiating fin, the pipe 22c, the lower channels of the rear radiating fin, the pipe 22b, and the lower channels of the front radiating fin. During the circulation, the coolant running through the channels 24 absorbs heat transmitted from the radiating surfaces 4 evenly across the radiating fins 16 in an efficient manner.

In general, in case where the transfer-mold type power semiconductor device is produced by transfer molding the inner components such as power semiconductor chips with resin, when the molding resin is cooled for solidification, the molding resin may shrink unevenly due to arrangement, material, and different linear expansion coefficients of the components. This may form warpage and/or undulation on the radiating surface 4 and the molding surface 6, which in turn causes a gap between the radiating surface 8 and the radiating fin 16, thereby reducing the cooling efficiency of the power semiconductor device.

However, according to the present embodiment of the present invention, such warpage and/or undulation on the radiating surface 4 can easily be corrected by a pair of the radiating fins 16 securely sandwiching the power modules 2 with fastening pressure across the radiating surfaces 4 thereof while effectively cooling the power modules 2.

As clearly shown in FIG. 2, while the control terminals extend upwardly from an upper (first) side surface of the power module 2 and the main terminals 8 extend downwardly from the opposite lower (second) side surface, the main terminals 8 are bent so as to extend in a direction perpendicular to the radiating surface 4.

Figure 3:
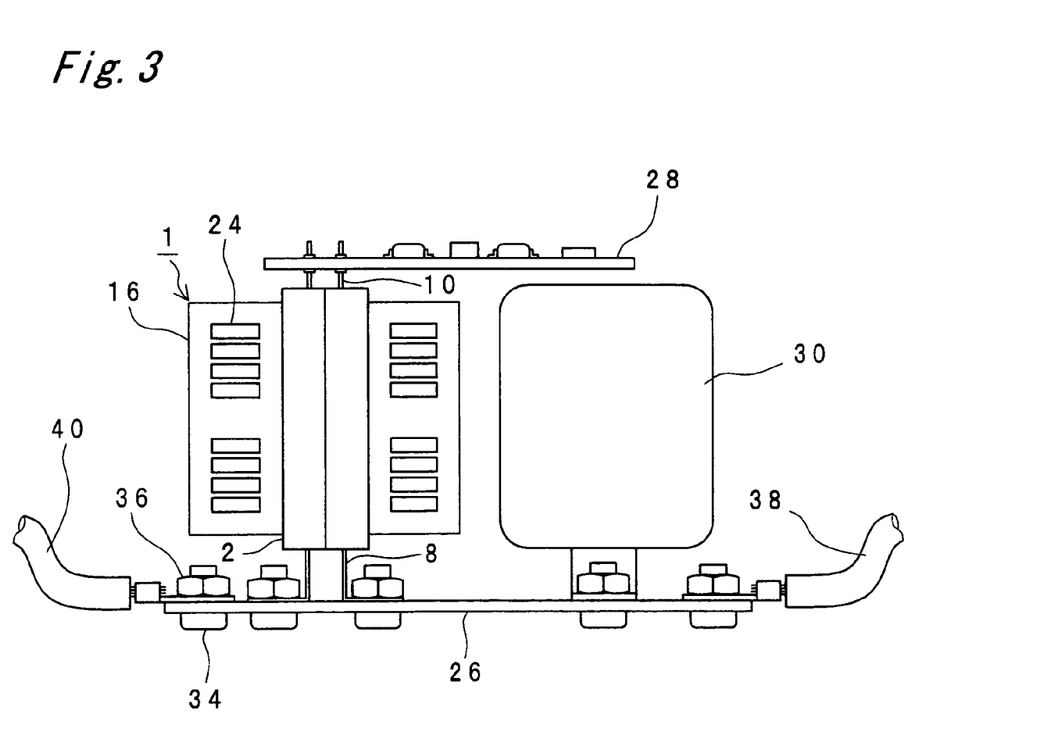
FIG. 3 is a side and partially cross sectional view of the power semiconductor device according to the first embodiment of the present invention.
Figure 4:
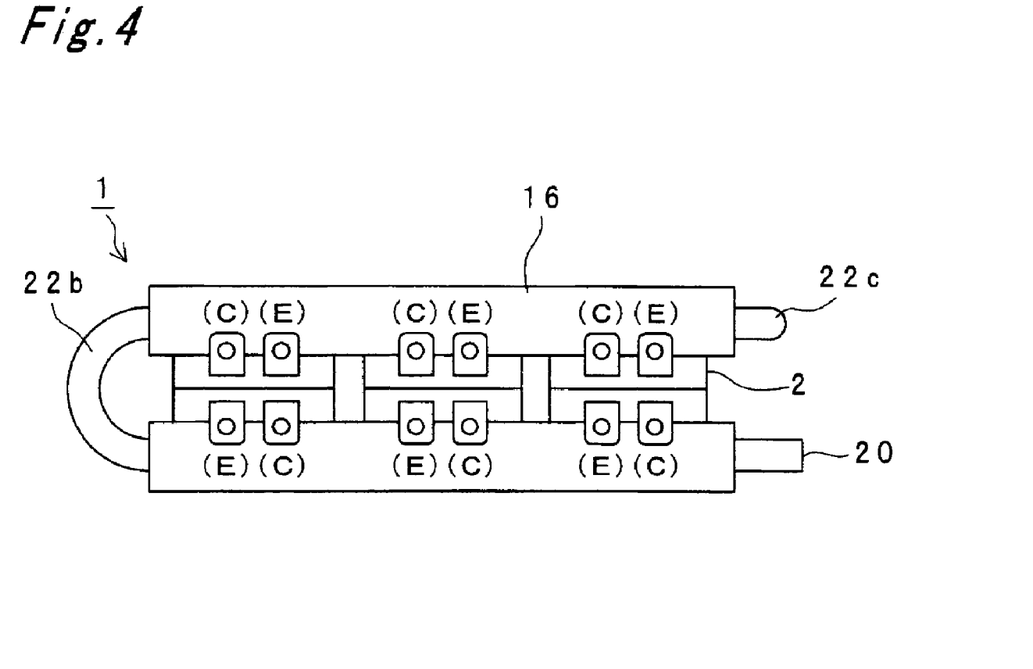
FIG. 4 is a bottom plan view of the power semiconductor device according to the first embodiment of the present invention.

FIG. 3 is a side and partially cross sectional view of the power semiconductor device 1 (the radiating fins 16 are drawn in the cross sectional view), including a control board 28 electrically connected with the control terminals 10 and a parallel wiring board 26 on which the main terminals 8 are secured. FIG. 4 is a bottom plan view of the power semiconductor device 1 of FIG. 1. Again, as illustrated also in FIGS. 1 and 3, the control terminals 10 of those power modules 2 extend upwardly and the main terminals 8 thereof extend downwardly. This arrangement of the main and control terminals 8, 10 facilitates electrical connection with the wiring and control boards 26, 28, respectively.

Besides, a large amount of direct current are switched to run through the main terminal 8 which generates electromagnetic interference (EMI), which may cause the control circuit to malfunction. In view of this point, the EMI from the main terminals 8, especially the EMI from a portion thereof covered by resin package, can advantageously be blocked by the radiating fins 16 sandwiching the power modules 2, thereby preventing the malfunction of the control circuit on the control board 28. Thus, a pair of the radiating fins 16 serves a function as shielding plates of the EMI, which requires no separate electromagnetic shielding plate. This reduces the production cost and simplifies the structure of the power semiconductor device.

Further, the arrangement of the control board 28 extending in a direction perpendicular to the main surfaces of the power modules 2 allows the wiring length of the control terminals 10 to be minimized, which improves the electromagnetic susceptibility of the control circuit on the control board 28, and downsizes the power semiconductor device 1 as a whole.

Electrical connection between the control board 28 and the control terminals 10 may be made, for example, by means of soldering or a connector.

As described above and illustrated in FIG. 3, each of the main terminals 8 is provided with a bent portion perpendicularly bent towards the radiating fin 16, which has a through-hole, and is secured on the wiring board 26 by fastening bolts 34 via the through-holes with nuts 36. Thus, the bent portion of the main terminal 8 facilitates assembling the main terminal with the wiring board 26.

Figure 5A:
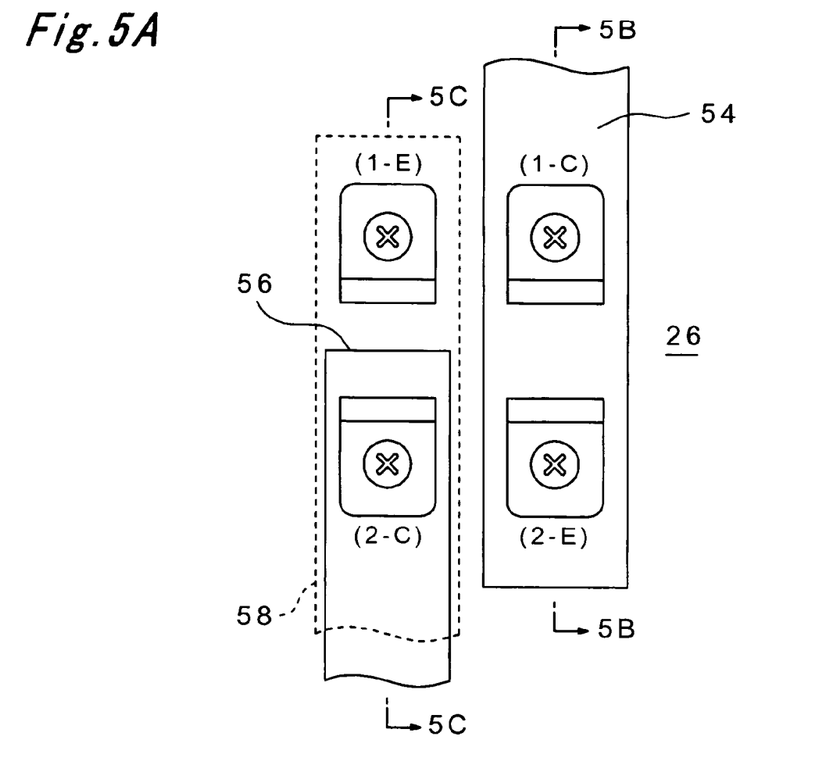
FIG. 5A is a top plan view of a parallel wiring board of FIG. 3, illustrating upper and lower conductive patterns and main terminals of a pair of the power modules.
Figure 5B:
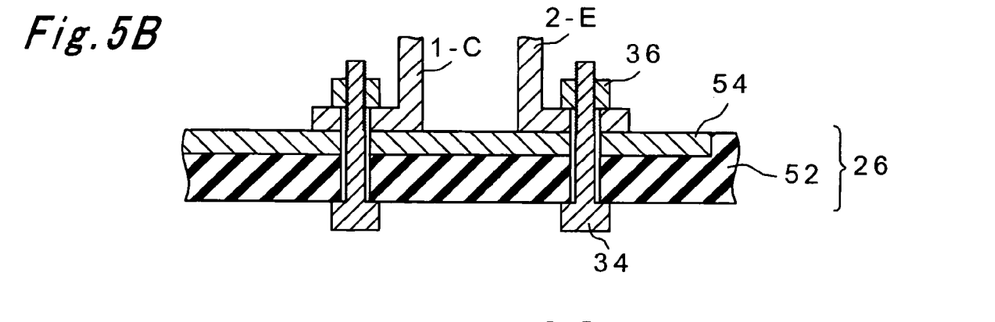
FIGS. 5B and 5C are cross sectional views taken along lines 5B-5B and 5C-5C, respectively.
Figure 5C:
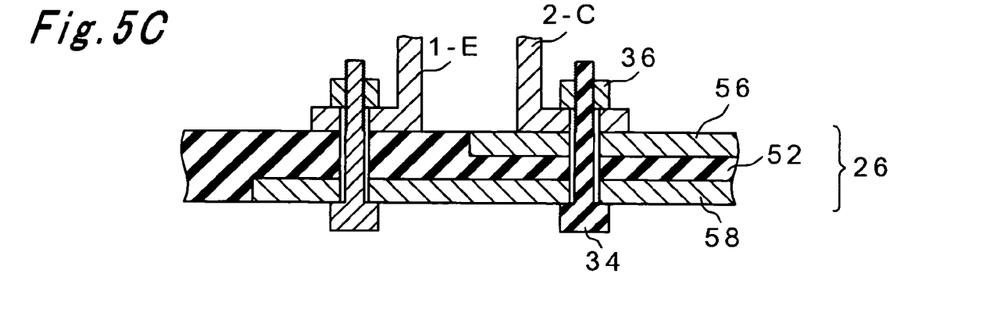

In the meantime, FIG. 5A is a top plan view of the parallel wiring board 26, illustrating upper and lower conductive patterns and main terminals of the paired power modules 2 of FIG. 4. It should be noted that since FIGS. 4 and 5A are the bottom plan view and the top plan view, respectively, the positions of the emitter and collector are oppositely illustrated. Also, FIGS. 5B and 5C are cross sectional views taken along lines 5B-5B and 5C-5C, respectively.

In particular, the parallel wiring board 26 includes an AC pattern 54 formed of conductive material on an upper surface of a substrate or base of insulating material, and the AC pattern 54 is electrically connected to one of AC outputs 40 such as U, V, W outputs. The parallel wiring board 26 also includes negative and positive patterns 56, 58 of conductive material, which are electrically connected to DC negative and positive inputs 38. The DC negative and positive patterns 56, 58 are formed on the upper and lower surfaces of the substrate or base 52 of the parallel wiring board 26, respectively, so as to oppose to each other. Thus, when a pair of the power modules 2 of FIG. 4 is secured on the parallel wiring board 26, as shown in FIGS. 5A and 5B, the collector terminal (1-C) of the first power module and the emitter terminal (2-E) of the second power module are electrically connected with the AC pattern 54 on the upper surface of the wiring board 26 by means of screws and nuts of conductive material. Also, as shown in FIGS. 5A and 5C, the emitter terminal (1-E) of the first power module is electrically connected with the positive pattern 58 by means of a screw and a nut of conductive material, while the collector terminal (2-C) of the second power module is electrically connected with the negative pattern 56, for example, by means of a screw of insulating material and a nut of conductive material.

In the power semiconductor device 1, since a substantial amount of current is flown through the negative and positive patterns 56, 58, the inductances thereof are required to be minimized for reducing the power loss. Minimizing inductances thereof requires, for example, the wiring length of the DC patterns 56, 58 up to a smoothing capacitor 30 to be reduced, the peripheral length of the cross section of the DC patterns 56, 58 to be increased, and the gap between the DC patterns 56, 58 to be reduced. In this embodiment, since the DC patterns 56, 58 are formed on the upper and lower surfaces of the wiring board 26 so as to oppose each other, the gap between the DC patterns 56, 58 can be minimized for reducing the inductance of the power semiconductor device 1.

Also, in the present embodiment, although the AC pattern 54 is formed on the upper surface, it may be formed on the lower surface of the wiring board 26.

Embodiment 2

Figure 6:
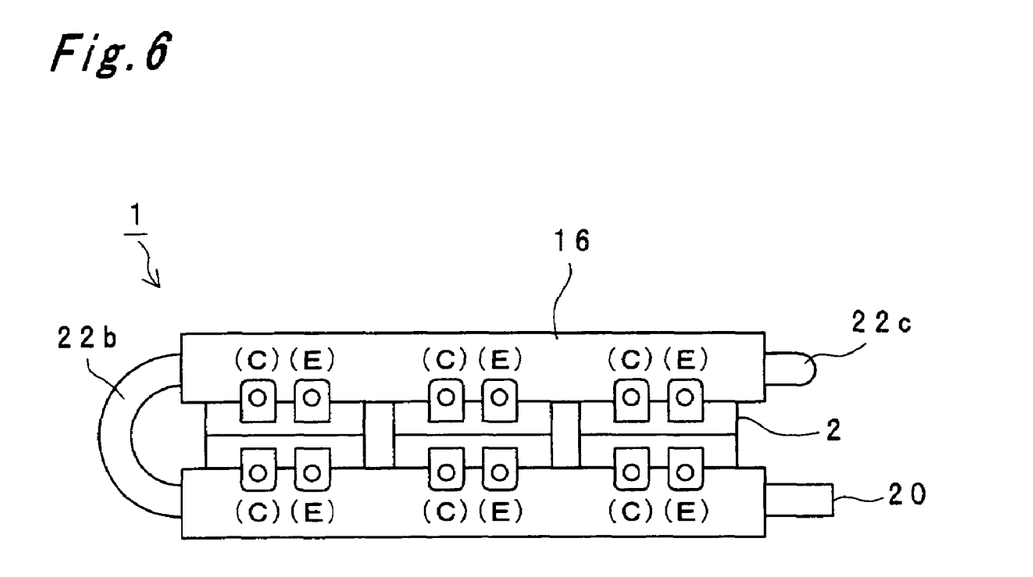
FIG. 6 is a bottom plan view of the power semiconductor device according to the second embodiment of the present invention.

FIG. 6 is a bottom plan view of another power semiconductor device according to the second embodiment of the present invention. The power semiconductor device 1 of the second embodiment has components similar to those of the first embodiment, which are denoted with similar reference numerals and no duplicate description will be made therefor.

In the first embodiment shown in FIG. 4, the collector terminal (C) of one of the paired power modules 2 opposes to the emitter terminal (E) of another one of the paired power modules 2, and vice versa. Contrary, in the second embodiment illustrated in FIG. 6, the collector/emitter terminals of the paired power modules 2 oppose to each other. The paired power modules 2 have similar structure (configuration and/or electrical features) except the positions of the collector/emitter terminals. Thus, when viewing from the direction perpendicular to the molding surface, one of the paired power modules 2 has the emitter terminal at the left side and the collector terminal at the right side, while another one of the paired power modules 2 has the emitter terminal at the right hand and the collector terminal at the left hand. Therefore, after the paired power modules 2 of the second embodiment are assembled, the collector/emitter terminals thereof oppose to each other.

The opposing collector/emitter terminals may be electrically connected to each other via the conductive pattern or bus-bars, which allows the capacity of current to be increased double.

Embodiment 3

FIG. 3 is a side and partially cross sectional view of the power semiconductor device 1 according to the third embodiment of the present invention (the radiating fins 16 are drawn in the cross sectional view). The power semiconductor device 1 of the third embodiment has components similar to those of the first embodiment, which are denoted with similar reference numerals and no duplicate description will be made therefor.

In the first embodiment shown in FIG. 3, the smoothing capacitor 30 is mounted on the parallel wiring board 26 away from the power modules 2. On the other hand, in the third embodiment illustrated in FIG. 7, the smoothing capacitor 42 is arranged and sandwiched between the paired power modules 2. Preferably, the smoothing capacitor 42 has a rectangular solid body with flat and parallel surfaces for secure fixation, thus for example, it may consist of a ceramic capacitor. Also, in the third embodiment as the above-described embodiments, a pair of radiating fins 16 sandwiches three pairs of the power modules 2, pressing each of the radiating surfaces thereof to securely hold the power modules 2.

Figure 7:
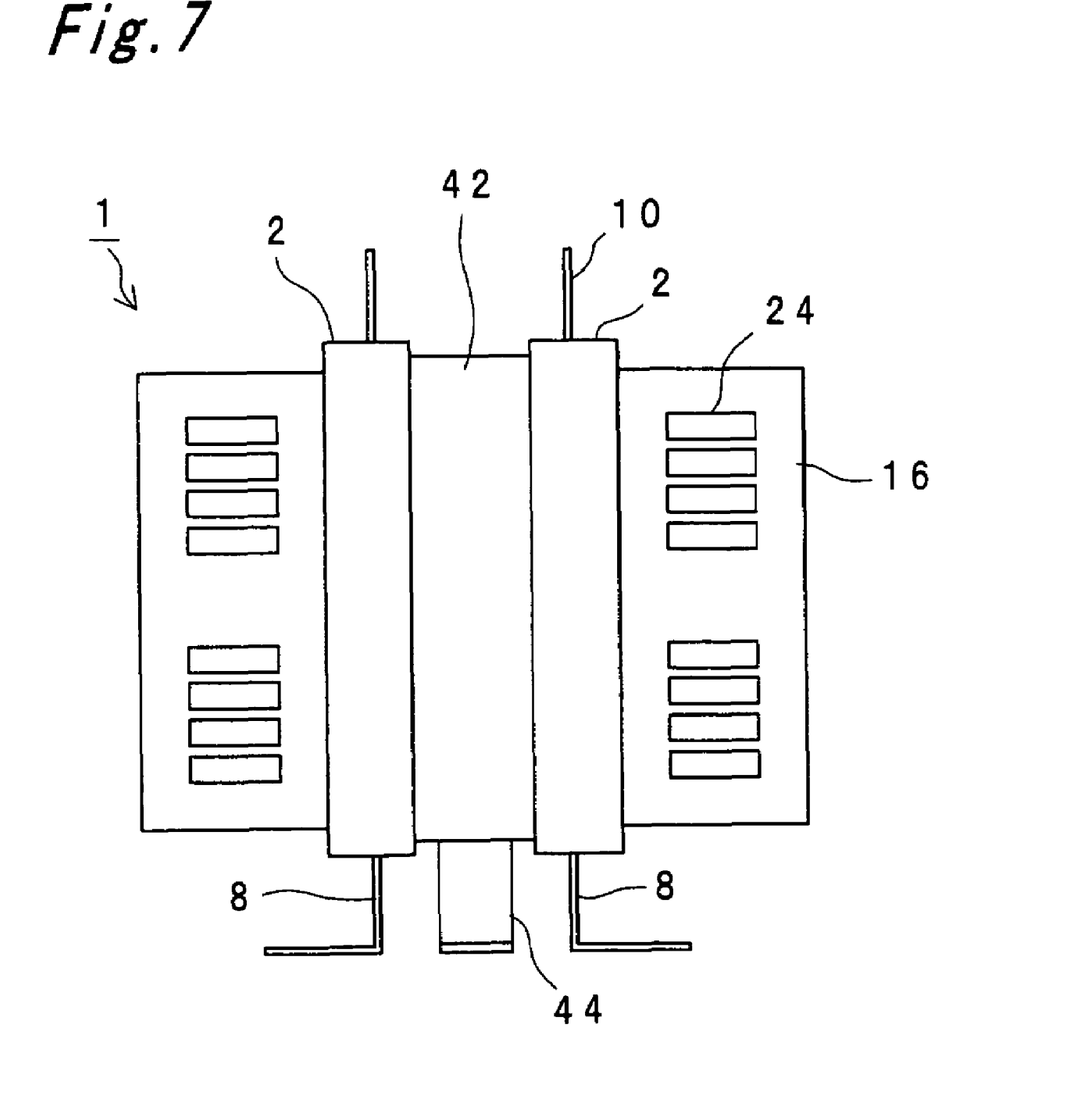
FIG. 7 is a side and partially cross sectional view of the power semiconductor device according to the third embodiment of the present invention.

The smoothing capacitor 42 includes a pair of main terminals, each of which has a bent portion 44 perpendicularly bent as the terminals of the power modules 2. Also, the bent portion 44 of the main terminal of the smoothing capacitor 42 has a through-hole, and the smoothing capacitor 42 is secured on the parallel wiring board 26 by fastening bolts via the through-holes with nuts. This arrangement of the smoothing capacitor beside the power modules 2 shortens (minimizes) the pattern (wiring) length on the wiring board 26, thereby reducing the inductance (the power loss) of the power semiconductor device 1.

Figure 8:
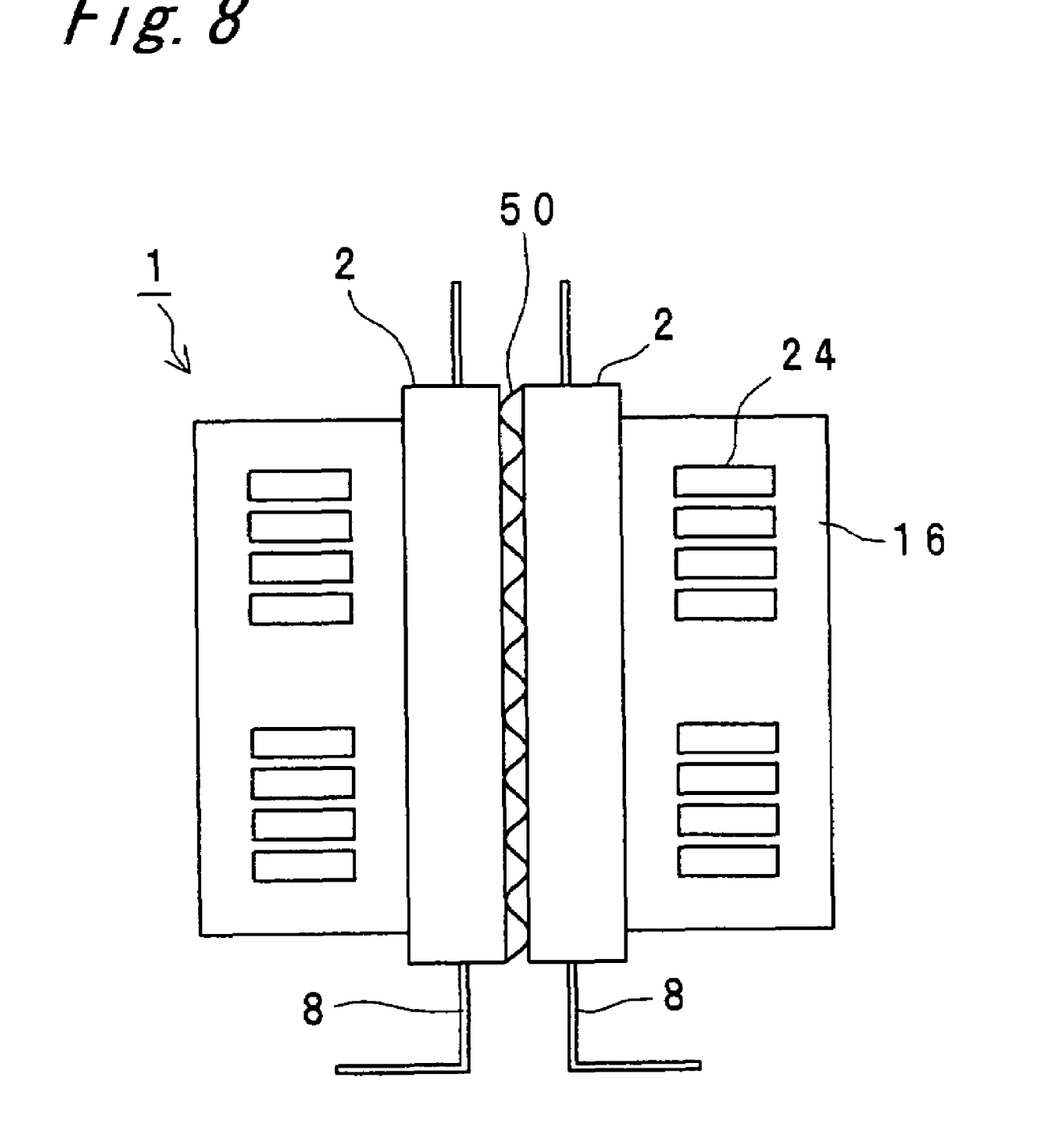
FIG. 8 is a side and partially cross sectional view of the power semiconductor device according to modification of FIG. 7.

Alternatively, as illustrated in FIG. 8, a plate spring 50 may be provided between the paired power modules 2 for biasing the power modules 2 outwardly, i.e., towards the radiating fins 16. When one of the power modules 2 intervened between the paired radiating fins 16 is thinner than the others, the plate spring 50 facilitates close contact between the radiating surface of the thinner power module 2 and the radiating fin for cooling the thinner power module 2 efficiently and equally as the others.

Also, in case where the paired power modules 2 are screwed with each other, the local portion thereof to be screwed may have the creeping, loosening the screw. However, the spring plate 50 between the paired power modules 2 distributes the fastening force due to the screw equally across the power modules 2, thereby preventing the fastening pressure from decreasing due to the resin creeping avoiding.

Embodiment 4

Figure 9:
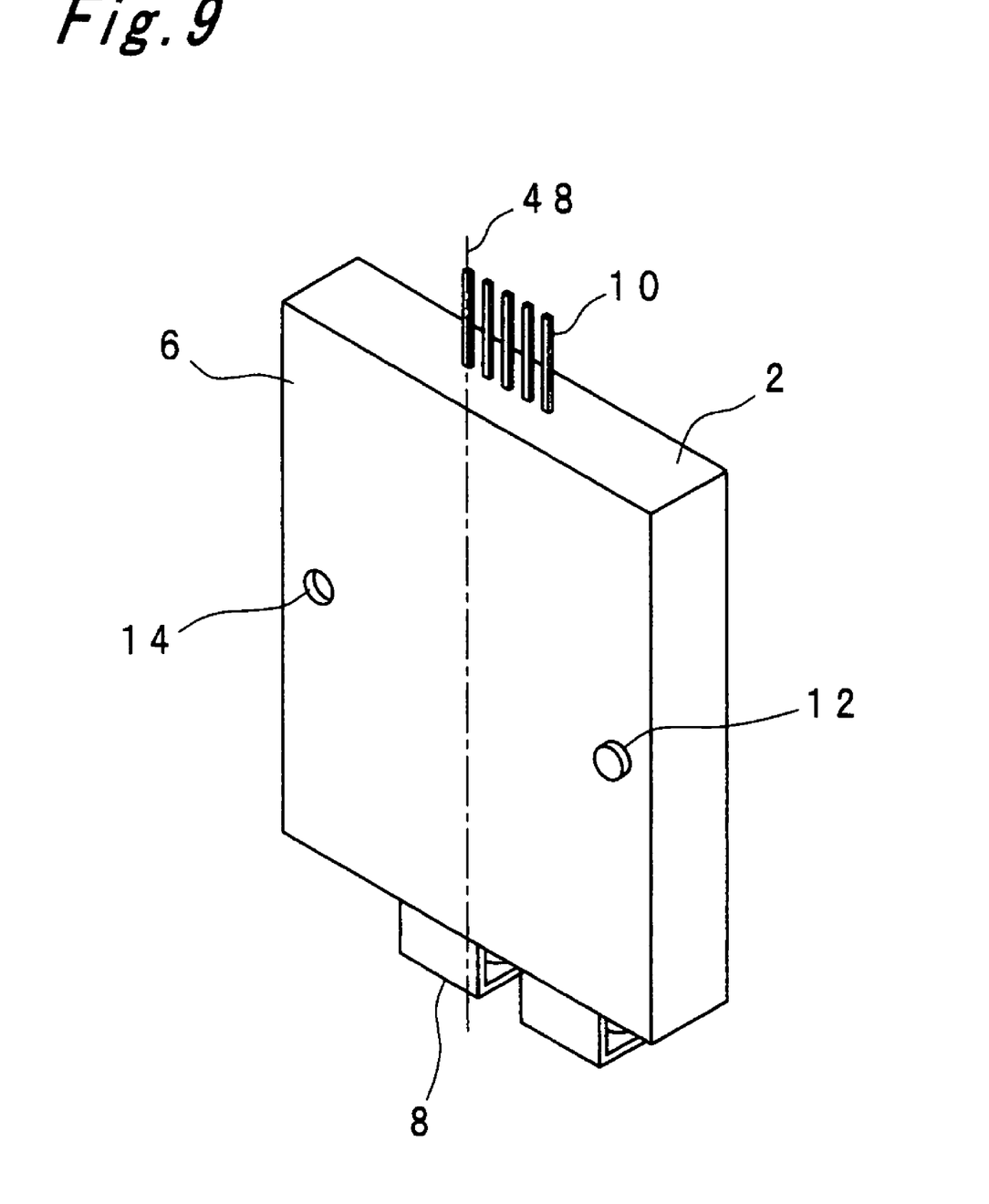
FIG. 9 is a perspective view of a power semiconductor device according to the fourth embodiment of the present invention.

FIG. 9 is a perspective view of the power semiconductor device 1 according to the fourth embodiment of the present invention. The power module 2 of the fourth embodiment is similar to that of the first embodiment, which are denoted with similar reference numerals and no duplicate description will be made therefor.

The power module 2 of the fourth embodiment includes the molding surface 6 having a boss 12 and a recess 14 which are arranged symmetrically relative to a vertical center line 48 of the power module 2. The boss 12 and the recess 14 are sized and shaped such that the boss 12 is fit in the recess 14 when the paired power modules 2 are assembled as FIGS. 1 and 3. This facilitates assembling the power semiconductor device 1, without misalignment of the power modules 2.

In the present embodiment, the boss and the recess are arranged symmetrically relative to the vertical center line 48 of the power module 2, they are positioned symmetrically relative to the any center lines running through the center point of the molding surface such as a horizontal center line.

What is claimed is:

1. A power semiconductor device, comprising:
   at least one pair of power modules including a first power module and a second power module, each of said power modules formed in a separate resin package, each having a substantially flat molding surface covered with molding resin and a radiating surface opposite to the molding surface; and
   a pair of radiating fins sandwiching said power modules such that the molding surfaces of the resin package of said power modules directly contact each other and the radiating surfaces of the resin package each contact said radiating fins,
      wherein each of said power modules includes a pair of main terminals and at least one control terminal, and each of said power modules further having first and second side surfaces opposite to each other,
      wherein the main terminals of said power modules extend from the first side surfaces and have emitter and collector terminals, the emitter terminal of the first power module opposes to the collector terminal of the second power module, and the collector terminal of the first power module opposes to the emitter terminal of the second power module, and
      the control terminal of said power module extends from the second side surface.

2. The power semiconductor device according to claim 1, further comprising:
   a smoothing capacitor having a pair of capacitor terminals; and
   a wiring board for mounting said power modules and said smoothing capacitor, said wiring board including a positive pattern for electrical connection between the emitter terminal of the first power module and one of the capacitor terminals, and a negative pattern for electrical connection between the collector terminal of the second power module and the other one of the capacitor terminals,
      wherein the positive and negative patterns are formed on lower and upper surfaces of said wiring board so as to oppose to each other.

3. The power semiconductor device according to claim 1, further comprising a control board electrically connected with the control terminal.

4. The power semiconductor device according to claim 1, wherein each of the main terminals of said power modules has a bent portion for mounting on a wiring board.

5. The power semiconductor device according to claim 1, further comprising a smoothing capacitor intervened between the molding surfaces of said power modules.

6. The power semiconductor device according to claim 1, further comprising a spring intervened between the molding surfaces of said power modules.

7. The power semiconductor device according to claim 6, wherein the boss and the recess are arranged symmetrically relative to a center line running through a center point of the molding surface.

8. The power semiconductor device according to claim 1, wherein each of said first and second power modules including a boss and a recess on the molding surface; and
   wherein the boss and the recess of said first power module fit the recess and the boss of said second power module, respectively.

9. A power semiconductor device, comprising:
   at least one pair of power modules, each of said power modules formed in a separate resin package, each having a substantially flat molding surface covered with molding resin and a radiating surface opposite to the molding surface; and
   a pair of radiating fins sandwiching said power modules such that the molding surfaces of the resin package of said power modules directly contact each other and the radiating surfaces of the resin package each contact said radiating fins,
      wherein the pair of said radiating fins includes first and second radiating fins, each of which includes a pair of coolant channels;
      wherein ones of the coolant channels of said radiating fins are in fluid communication with each other via a first pipe, and the others of the coolant channels of said radiating fins are in fluid communication with each other via a second pipe; and
      wherein said first radiating fin includes an inlet and an outlet, and said second radiating fin includes a third pipe for fluid communication between one of the coolant channel and the other of the coolant thereof;
      whereby coolant circulates from the input to the output via the coolant channels of said radiating fins and first through third pipes.

10. A power semiconductor device, comprising:
a first power module including a first resin package having a first flat molding surface covered with molding resin, a first radiating surface opposite to the first molding surface, a first emitter and first collector terminal extending from said first resin package;
a second power module including a second resin package having a second flat molding surface covered with molding resin, a second radiating surface opposite to the second molding surface, a second emitter and second collector terminal extending from said second resin package, wherein electrical connection between the first collector terminal of said first power module and the second emitter terminal of said second power module is made outside said first and second resin packages; and
a pair of radiators sandwiching said first and second power modules such that the first and second molding surfaces of said first and second power modules contact each other and the first and second radiating surfaces thereof each contact said radiators.

11. The power semiconductor device according to claim 10,
wherein each of said first and second power modules includes at least one control terminal extending from said first and second resin packages, respectively.

12. The power semiconductor device according to claim 10,
wherein the first emitter terminal of said first power module opposes to the second collector terminal of said second power module, and the first collector terminal of said first power module opposes to the second emitter terminal of said second power module.

13. The power semiconductor device according to claim 10, further comprising:
a smoothing capacitor having a pair of capacitor terminals; and
a wiring board for mounting said first and second power modules and said smoothing capacitor, said wiring board including a positive pattern for electrical connection between the first emitter terminal of said first power module and one of the capacitor terminals, and a negative pattern for electrical connection between the second collector terminal of said second power module and the other one of the capacitor terminals,
wherein the positive and negative patterns are formed on lower and upper surfaces of said wiring board so as to oppose to each other.

14. The power semiconductor device according to claim 10, further comprising a control board electrically connected with the control terminal.

15. The power semiconductor device according to claim 10,
wherein each of the terminals of said first and second power modules has a bent portion for mounting on a wiring board.

16. The power semiconductor device according to claim 10,
wherein the pair of said radiators includes first and second radiators, each of which includes a pair of coolant channels;
wherein ones of the coolant channels of said radiators are in fluid communication with each other via a first pipe, and the others of the coolant channels of said radiators are in fluid communication with each other via a second pipe; and
wherein said first radiator includes an inlet and an outlet, and said second radiator includes a third pipe for fluid communication between one of the coolant channel and the other of the coolant thereof;
whereby coolant circulates from the input to the output via the coolant channels of said radiators and said first through third pipes.

* * * * *